United States Patent [19]

Thiré

[11] Patent Number: 4,484,208

[45] Date of Patent: Nov. 20, 1984

[54] JUNCTION-TYPE FIELD-EFFECT TRANSISTOR AND ITS MANUFACTURE

[75] Inventor: Jacques Thiré, Caen, France

[73] Assignee: U.S. Philips Corporation, New York, N.Y.

[21] Appl. No.: 540,706

[22] Filed: Oct. 11, 1983

Related U.S. Application Data

[63] Continuation of Ser. No. 161,850, Jun. 23, 1980, abandoned.

[30] Foreign Application Priority Data

Jun. 29, 1979 [FR] France ................. 79 16970

[51] Int. Cl.³ .................. H01L 29/80; H01L 29/06; H01L 29/90
[52] U.S. Cl. .................. 357/22; 357/13; 357/20
[58] Field of Search ............. 357/22, 13, 20

[56]  References Cited

U.S. PATENT DOCUMENTS 3,725,136  4/1973  Morgan ................. 357/22
4,053,915 10/1977  Cave ................... 357/22
4,066,917  1/1978  Compton et al. ......... 357/22
4,143,386  3/1979  Kaiser ................. 357/22
4,176,368 11/1979  Compton ............... 357/22
4,314,267  2/1982  Bergeron et al. ........ 357/22

Primary Examiner—Martin H. Edlow
Assistant Examiner—Jerome Jackson
Attorney, Agent, or Firm—Robert T. Mayer; Steven R. Biren

[57]  ABSTRACT

The channel region and gate region of a junction-type field-effect transistor have substantially the same outline and can be produced by successive implantation through the same mask. A highly doped contact zone ensures an ohmic connection between this gate region and the other portion of the gate formed by the part of the layer situated below the channel region. Such a transistor may have a low threshold voltage while being comparatively easy to manufacture, for example, in an integrated circuit with bipolar transistors. The contact zone may be formed simultaneously with a bipolar transistor emitter zone.

3 Claims, 5 Drawing Figures

JUNCTION-TYPE FIELD-EFFECT TRANSISTOR AND ITS MANUFACTURE

This is a continuation of application Ser. No. 161,850, filed June 23, 1980, now abandoned.

BACKGROUND OF THE INVENTION

1. Field of the Invention

The invention relates to junction-type field-effect transistors, especially but not exclusively very sensitive field-effect transistors which operate on low supply voltages with low threshold voltages and which may be used in particular as input elements for low noise level operational amplifiers, for example the amplifiers installed in sensors for medical uses. The invention also relates to the manufacture of such transistors. Experience has shown that, at present, very sensitive transistors of this type can only be made satisfactorily, at least as far as their channel and gate regions are concerned, by means of ion implantation. To obtain a very high sensitivity the channel and gate regions (particularly the channel region) must in fact be extremely thin and lightly doped; it is almost impossible to do this, in a reproducible fashion, other than by implantation.

2. Description of the Prior Art.

A known junction-type field-effect transistor comprises, adjacent to the surface of a semiconductor layer of the first conductivity type,

- a first, highly doped, source region of the second conductivity type,
- a second, highly doped, drain region of the second conductivity type and spaced from the source region,
- a third, gate region of the first conductivity type extending between the first and second regions and in ohmic contact with said layer, and
- a fourth, lightly doped, channel region of the second conductivity type, located below the third region and also extending between the first and second regions. This transistor structure, which can be created using implantation, can be incorporated in an integrated circuit also comprising further similar transistors and other transistors of the bipolar type.

In the known transistors, the third region (gate region) is, according to the specific type, either connected or not connected to the semiconductor layer, the deep part of which situated below the channel region, cooperates with the gate region. This connection is often made, particularly when it is a case of improving the sensitivity of the transistor; the semiconductor layer and the third region are then always at the same potential.

To bring about this connection, the third region projects in relation to the subjacent channel region in such a way that it makes contact laterally with the semiconductor layer. This is shown, for example, in French Pat. No. 1 431 642, which is concerned with a field-effect current limiter in which the upper control region (gate) of N-type conductivity is diffused in a larger diffused region of P-type conductivity which includes the source, substrate and channel. The gate region, with a rectangular surface, extends in length along both sides of the P-type region and then comes into contact with the material of N-type conductivity in which the device has been created and a deep part of which constitutes the lower control region.

To obtain the desired connection between the gate region and the semiconductor layer of the same conductivity type in such a field-effect transistor created using implantation, the channel region is created in a first implantation operation and through a first mask, then the gate region is created in a second implantation operation and through a second mask of dimensions greater than those of the first mask.

These masking operations are in addition to those required for the production of bipolar transistors in an integrated circuit comprising the two types of transistors. They inevitably place a burden on the manufacture of such an integrated circuit.

SUMMARY OF THE INVENTION

According to a first aspect of the invention, there is provided a junction-type field-effect transistor having a semiconductor body comprising a semiconductor layer of a first conductivity type adjoining a surface, source and drain zones of the second, opposite conductivity type embedded in said semiconductor layer and adjoining said surface, a surface-adjacent layer-shaped gate region of said first conductivity type, and an underlying layer-shaped channel region of said second conductivity type, said gate region and said channel region both extending between said source and drain zones, said gate region being connected with said semiconductor layer by at least one highly doped connection zone of said first conductivity type, characterized in that said gate region and said channel region both extend up to said source- and drain zones and form part of respectively a semiconductor region of said first conductivity type and a semiconductor region of said second conductivity type, said semiconductor regions of first and second conductivity type having substantially the same outline, and said connection zone adjoining said semiconductor region of the first conductivity type.

Such a field-effect transistor structure, the channel and gate regions of which can be created in particular using ion implantation, can be manufactured more easily with regard to the number of operations necessary and their compatibility with those which may be used to fabricate other transistors in an integrated circuit. The structure permits a beneficial combination of the respective advantages of implantation and diffusion techniques.

The two zones of the first and second conductivity types have substantially the same outline when they are created through the same mask; this means a single photo-engraving operation and a single etching operation to form the two regions of gate and channel, and thus a saving in means of production, in time spent, and a reduction in the risks run in connection with handling the semiconductor wafers in which the transistors are formed.

Thus, according to a second aspect of the present invention, there is provided a process for making such a transistor, according to which the said zones including the third and fourth regions are obtained by successive ion implantations through the same implantation mask.

On the other hand, it is important to note that the formation of said semiconductor contact zone does not require the making of a special mask. This zone, which can be obtained advantageously by diffusion, can be created at the same time and through windows of the same mask used for other semiconductor zones of the same conductivity type belonging to neighboring components of the transistor which are made on the wafer substrate; the said contact zone can be formed, for example, simultaneously with the emitter zones of bipolar transistors.

The advantage of ease of manufacture for transistor structures in accordance with the invention can be obtained without significantly reducing performance in comparison with similar transistors manufactured according to the previous state of the art. Experience has shown in particular that the presence of a highly doped intermediate contact zone between the third region and the semiconductor layer need cause no substantial reduction in the gate/channel breakdown voltage. Furthermore, this breakdown voltage is essentially dependent on the doping concentration in the channel region, and this concentration can be made low by the use of the implantation technique.

It is preferable if the first and second regions, those of source and drain respectively, are created by diffusion. These are the regions on which a contact will have to be made and it is important for their surface to be highly doped, which does not present any drawback in the functioning of the transistor.

On the other hand, the fourth region (channel region) and preferably the third region (gate region) should be created by ion implantation in order to obtain low doping concentrations which allow the threshold voltage of the transistor to be small.

The expression "highly doped" applies to those parts of the transistor which are doped with an impurity concentration greater than $5 \times 10^{17}$ atoms/cm$^3$. The expression "lightly doped" applies in the case of a concentration of less than $5 \times 10^{17}$ atoms/cm$^3$.

The thickness of the highly doped semiconductor contact zone which establishes an ohmic contact between the third region and the semiconductor layer can, in principle, be approximately the same as, and need be not greater than that of said third region. It may be at least as thick as the total thickness of the third and fourth regions. In practice this zone can extend in depth beyond the fourth region without any problem, and this may occur when, for example, it is created at the same time as the emitters of neighbouring bipolar transistors, emitters whose thickness is often greater than that of the third and fourth joined regions.

BRIEF DESCRIPTION OF THE DRAWING

Embodiments of the first and second aspects of the invention will now be described, by way of example, with reference to the accompanying drawing.

FIGS. 1 to 3 represent in schematic form a first transistor in accordance with the invention, this transistor being seen in plan view in FIG. 1, while FIGS. 2 and 3 are cross-sections, along the lines II—II and III—III respectively in FIG. 1.

FIG. 4 is a plan view of this transistor, while FIG. 5 is a cross-section following the line V—V in FIG. 4.

DESCRIPTION OF THE PREFERRED EMBODIMENTS

It should be noted that in the figures the dimensional relationships between various elements and within these elements themselves have not been respected, in order to render the figures clear. The thickness of the layers in relation to their areas in particular has been considerably increased. Moreover, and still with regard to clarity, the semiconductor parts having the same type of conductivity have been hatched in the same direction.

Figure 1:
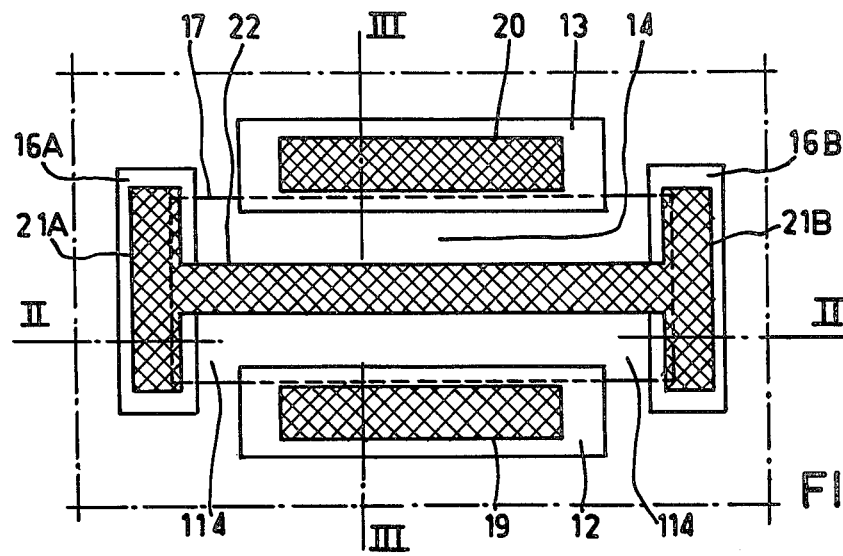
Figure 2:
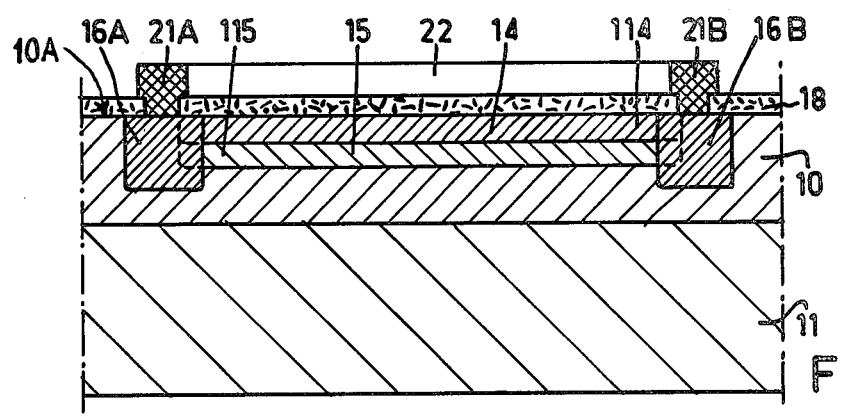
Figure 3:
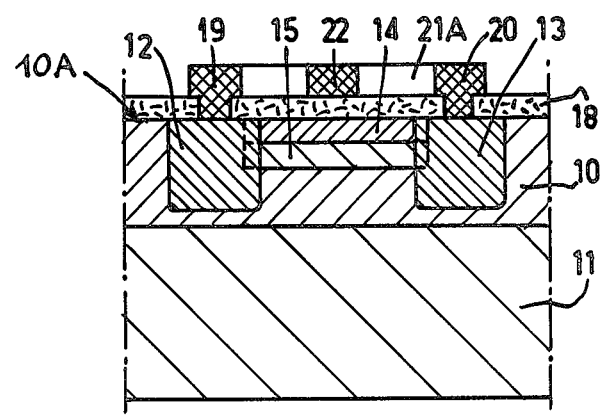

The field-effect junction transistor illustrated in FIGS. 1, 2 and 3 is formed in a semiconductor layer 10, of a first conductivity type, resting on a substrate 11 of the second conductivity type. The substrate 11 and the layer 10 as shown in FIGS. 1 to 3 represent a tiny fraction of the semiconductor wafer on which other components have been created, including, for example, further transistors such as those in accordance with the invention and also bipolar transistors; these components taken as a whole form an integrated circuit.

The transistor as illustrated comprises the following regions:

a first region 12 which is the source region, is of the second conductivity type and is highly doped;

a second region 13 which is the drain region, is separate from region 12, but is also of the second conductivity type and highly doped;

(Regions 12 and 13 have, for example, a surface geometry which is rectangular in shape and are arranged in parallel along their length as is shown in FIG. 1).

a third region 14, which is the gate region, is of the first conductivity type, is situated at the surface between the first and second regions 12 and 13, extends as far as these regions 12 and 13 and, moreover, is in ohmic contact with the said layer 10, and a fourth region 15, which is the channel region, is of the second conductivity type, is lightly doped, is located below the third region 14 and also extends as far as the first and second regions 12 and 13.

In accordance with the present invention, the third and fourth regions 14 and 15 form part, respectively, of a zone 114 of the first conductivity type and of a zone 115 of the second conductivity type which have substantially the same outline, and the ohmic contact between the third region 14 and the said layer 10 is obtained by means of at least one semiconductor contact zone 16 which is of the first conductivity type. Zone 16 is a highly doped zone created in said layer 10 and contacts the zone 114 of the first conductivity type, forming a connection zone.

The zones 114 and 115 extend laterally beyond the limit of length defined by the longitudinal sides of the regions 12 and 13 and extend into the layer 10 to reach the semiconductor zone 16. In the example shown in FIGS. 1 to 3, two semiconductor zones 16A and 16B have been provided and these have been created symmetrically in relation to the source and drain regions 12 and 13; this is with a view to optimizing the distribution of the gate voltage along the channel region 15.

The third region 14 and the fourth region 15 correspond to the middle parts of the zones 114 and 115 situated between the source region 12 and the drain region 13, the length of these regions 12 and 13 approximating (with the exception of edge effects) to the width of the transistor channel.

The partly continuous, partly dotted line 17 indicates the projection of the limits of the rectangular window of the mask through which the zones 114 and 115 have been created. These limits encroach upon the regions 12 and 13 and upon the zones 16A and 16B, as shown by the dotted line sections of line 17. But the outline of the zones 114 and 115 is in fact defined by the opposite edges of the regions 12 and 13 and the zones 16A and 16B, as well as by the section of continuous line of line 17; this is beause the doping concentrations for the zones 114 and 115 have been chosen to be low, and cannot modify the doping in the said regions 12 and 13 and zones 16A and 16B where the concentration is, in contrast, high.

The active side 10A of the layer 10 is covered with a thin insulating and passivating film 18, for example, of silicon oxide, in which windows have been provided making possible the establishment of metallic contacts 19, 20, 21A and 21B with the source region 12, the drain region 13 and the gate region 14 respectively. The contacts 21A and 21B are interconnected, for example, by the connection 22 which extends on the thin film 18.

Such a transistor in accordance with the invention can be made advantageously using the following process:

To begin with, the source region 12 and drain region 13 are formed by dopant diffusion, either separate from or together with a semiconductor region belonging to another component of the integrated circuit. Then the semiconductor zones 16A and 16B are formed, also by dopant diffusion, which may also be used at the same time to form, for example, the emitter regions of bipolar transistors of the integrated circuit. Then the zones 115 and 114 are made consecutively, through the same implantation mask (it is known that in the making of an integrated circuit implantation operations usually occur after those of diffusion): a first implantation makes it possible to introduce into the wafer impurities of the second conductivity type at a depth required for region 15; a second implantation permits the introduction of impurities of the first conductivity type at a depth less deep than the previous one and corresponding to region 14. Although preferable, it is not essential to operate in this order.

The implanted structure is annealed so that the implanted atoms which are in an interstitial position in relation to the atoms of the crustalline lattice after implantation, move into a substitutional position and so become electrically active dopants. The annealing conditions depend on the particular implantation conditions, but may, for example, take place in an atmosphere of nitrogen and/or oxygen at a temperature of approximately 850°–900° C.

As regards the nature of the mask employed during the implantation operations, a photopolymerizable lacquer may be used, for example, with a suitable thickness determined in accordance with the implantation energies used.

After the final annealing, the manufacture of the transistor, as well as that of the integrated circuit, is completed by the deposition of metallic contact and interconnection layers.

As a specific example some physical and dimensional characteristics concerning such a transistor for an integrated circuit in accordance with the invention are given below, together with conditions for principal operations which may be used in its production.

The substrate 11 is of P-type conductivity, and lightly doped, so that its resistivity is about 10 ohm.cm. The layer 10, of N-type is obtained by epitaxy; its doping is of the order of $10^{15}$ at/cm$^3$, and its thickness is from 15 to 20 $\mu$m.

The source and drain regions 12 and 13 are P-type, obtained by boron diffusion, and have a high doping of about $10^{18}$ at/cm$^3$ near the surface 10A; their thickness is from 2 to 3 $\mu$m.

The regions 16A and 16B, of N-type are obtained by phosphorus diffusion, and have a doping of the order of $10^{19}$ at/cm$^3$ at the surface. Their thickness is between 1.5 and 2.5 $\mu$m.

The zone 114, including the gate region 14, is of N-type and is produced by the implantation of phosphorous ions at an energy of 150 keV and with a dose averaging $1.6 \times 10^{12}$ at/cm$^2$. The maximum concentration, after implantation, is $4 \times 10^{17}$ at/cm$^3$ at a depth very close to 0.2 $\mu$m. After a final distribution annealing, the mean concentration in this zone is between $5 \times 10^{16}$ and $10^{17}$ at/cm$^3$.

The zone 115, including the channel region 15, is of P-type and is produced by the implantation of boron ions with an energy of 150 keV and with a dose averaging $1.6 \times 10^{12}$ at/cm$^2$. The maximum concentration, after implantation, is $5 \times 10^{15}$ at/cm$^3$ at a depth very close to 0.4 $\mu$m. After the final annealing, the mean concentration is between $5 \times 10^{14}$ and $10^{15}$ at/cm$^3$. A good quality ohmic contact is obtained by the zones 16A and 16B between the surface gate region 14 which is present between these zones and the deep gate region constituted by the portion of layer 10 situated immediately below the channel region 15.

The field-effect transistor described above has an elementary geometry. Other more complex versions are possible in accordance with the invention, in particular an "interdigitated" geometry in which source and drain subregions are arranged alternately, and are separated by gate subregions, a connecting layer establishing the necessary interconnections between the corresponding subregions in order to make up the complete regions of the transistor. When the invention is applied in this case, the mask defining the common outlines of the channel and gate regions would comprise as many openings as there are channel and gate subregions.

Figure 4:
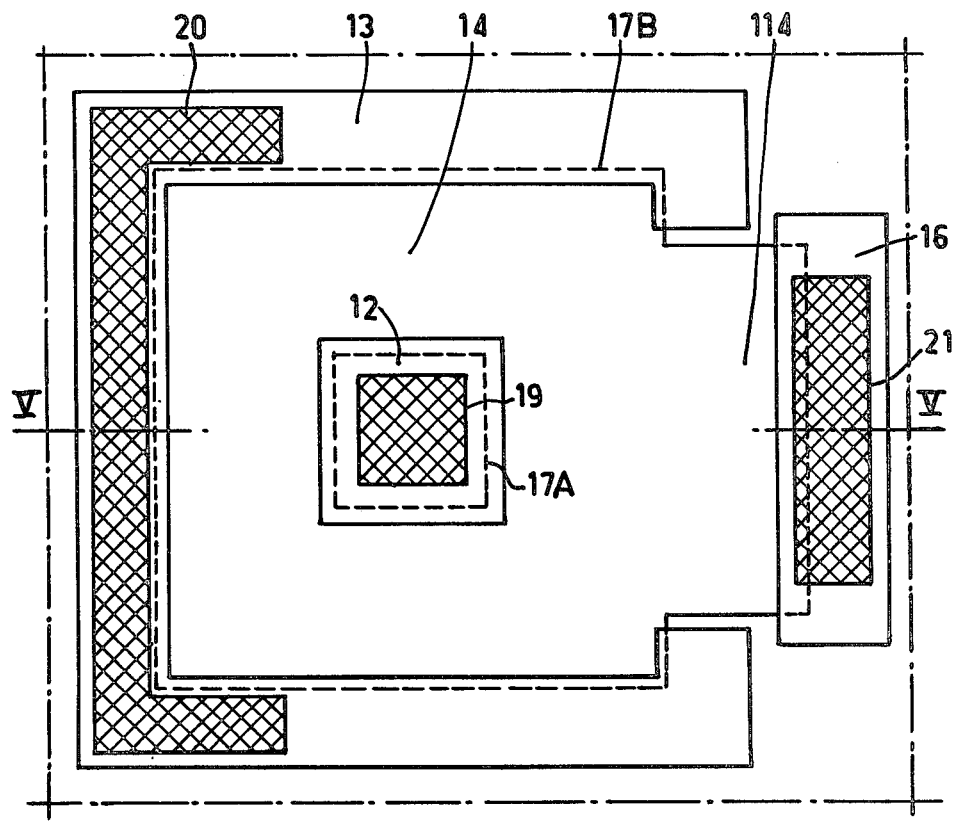
FIGS. 4 and 5 relate to a second transistor in accordance with the invention which is of a geometry different from that of FIG. 1.
Figure 5:
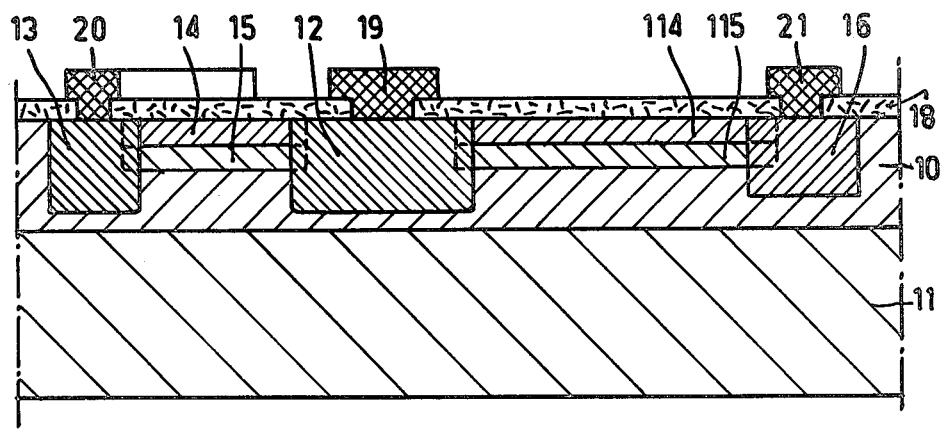

Another type of geometry is illustrated in simple form in FIGS. 4 and 5. This field-effect transistor is of the "concentric" type, the drain region surrounding the source region (or vice versa). In FIGS. 4 and 5, the same reference numerals as appear on FIGS. 1 and 3 have been retained for designating the similar elements.

In the central part of the layout, there is the source region 12 provided with its contact 19, and on the outside the drain region 13 is provided with its contact 20. The region 12 may be, for example, square in shape. The region 13 which surrounds it at a uniform distance is largely open on one of its sides, namely the one located to the right in FIG. 4.

The area occupied by the zones 114 and 115 is located in part between the regions 12 and 13 (gate region 14 and channel region 15) and in part outside the region 13 which it overlaps, to the right in FIG. 4, so as to merge into the zone 16; the zone 16 provides the ohmic contact between the region 14 and the layer 10.

The surface area through which the zones 114 and 115 have been implanted is that located between the lines 17A and 17B which follow the edge of the implantation window in the mask used.

FIGS. 4 and 5 also show contact 19 on the source region 12, contact 20 on the drain region 13, and contact 21 on the semiconductor zone 16.

What is claimed is:

1. A junction field effect transistor which comprises a semiconductor body having a major surface, a surface-adjacent semiconductor layer of a first conductivity type, spaced-apart and parallel source and drain zones of a second conductivity type opposite to that of the first in said semiconductor layer, a surface-adjacent layer-shaped gate region of said first conductivity type, and a layer-shaped channel region of said second conductivity type beneath said gate region, said gate region and said channel region both extending laterally to said source and drain zones, said gate region forming part of a first semiconductor zone of said first conductivity type and said channel region forming part of a second semiconductor zone of said second conductivity type, said first and second semiconductor zones being formed by ion implantation through the same mask, said first and second semiconductor zones extending longitudinally beyond said parallel source and drain zones in a direction parallel to said source and drain zones and being substantially longitudinally coextensive, and said gate region being connected to said semiconductor layer by at least one highly doped connection zone of said first conductivity type adjoining at least said first semiconductor zone of the first conductivity type.

2. A junction field effect transistor as claimed in claim 1 characterized in that said connection zone has a thickness substantially equal to the thickness of said gate region.

3. A junction field effect transistor as claimed in claim 1 characterized in that said connection zone has a thickness at least equal to the total thickness of said gate region and said channel region.

* * * * *